(12) United States Patent
Shimizu et al.

(10) Patent No.: US 7,852,388 B2
(45) Date of Patent: Dec. 14, 2010

(54) IMAGING DEVICE

(75) Inventors: Minako Shimizu, Kyoto (JP); Toshiya Fujii, Shiga (JP); Kazuyuki Inokuma, Kyoto (JP)

(73) Assignee: Panasonic Corporation, Osaka (JP)

( * ) Notice: Subject to any disclaimer, the term of this patent is extended or adjusted under 35 U.S.C. 154(b) by 647 days.

(21) Appl. No.: 11/802,299

(22) Filed: May 22, 2007

(65) Prior Publication Data

US 2007/0285539 A1 Dec. 13, 2007

(30) Foreign Application Priority Data

May 23, 2006 (JP) ............................... 2006-143313

(51) Int. Cl.
*H04N 3/14* (2006.01)
*H04N 5/335* (2006.01)
*H04N 9/04* (2006.01)
*H04N 9/083* (2006.01)

(52) U.S. Cl. ..................................... 348/272
(58) Field of Classification Search ................. 348/272, 348/273, 275, 277–280
See application file for complete search history.

(56) References Cited

U.S. PATENT DOCUMENTS

| | | | | |
|---|---|---|---|---|
| 4,350,729 A | * | 9/1982 | Nakano et al. | ............... 428/209 |
| 4,830,501 A | * | 5/1989 | Terashita | ..................... 356/402 |
| 6,346,969 B1 | * | 2/2002 | Kwon | .......................... 348/273 |
| 6,631,316 B2 | | 10/2003 | Stam et al. | |
| 6,960,799 B2 | | 11/2005 | Descure | |
| 2004/0257541 A1 | | 12/2004 | Iisaka | |
| 2005/0088550 A1 | * | 4/2005 | Mitsunaga et al. | .......... 348/272 |
| 2005/0151860 A1 | * | 7/2005 | Silverstein et al. | .......... 348/272 |
| 2006/0012808 A1 | | 1/2006 | Mizukura et al. | |
| 2006/0222324 A1 | | 10/2006 | Abe | |

FOREIGN PATENT DOCUMENTS

| | | |
|---|---|---|
| CN | 1573466 A | 2/2005 |
| CN | 1610412 A | 4/2005 |
| JP | 5-294183 | 11/1993 |

OTHER PUBLICATIONS

Chinese Office Action, w/ English translation thereof, issued in Chinese Patent Application No. CN 200710105075.6 dated Nov. 27, 2009.

* cited by examiner

*Primary Examiner*—Nhan T Tran
*Assistant Examiner*—Tuan H Le
(74) *Attorney, Agent, or Firm*—McDermott Will & Emery LLP (57) ABSTRACT

An imaging device free from discoloring under high temperature or high irradiation and having high color reproducibility is provided. Multilayer filters made of inorganic materials are provided above respective photoelectric conversion elements. The filters include red filters having predetermined spectra characteristics, green filters having predetermined spectral characteristics, and two kinds of blue filters having spectral characteristics different in peak wavelength.

8 Claims, 12 Drawing Sheets

IMAGING DEVICE

CROSS-REFERENCE TO RELATED APPLICATIONS

This application claims priority under 35 U.S.C. §119 on Patent Application No. 2006-143313 filed in Japan on May 23, 2006, the entire contents of which are hereby incorporated by reference.

BACKGROUND OF THE INVENTION

1. Field of the Invention

The present invention relates to an imaging device, and more particularly, to a technology of permitting an imaging device that requires high reliability and is often used under low color rendering illumination, such as a car-mounted imaging device, to provide good images.

2. Description of Related Art

In recent years, to enhance the safety of travel of vehicles, there have been proposed a number of systems of monitoring the surroundings of a vehicle with an imaging device mounted in the vehicle and systems using various types of information included in a monitored image.

Examples of such systems include, for example: a system in which motion of a neighboring vehicle is detected from a video signal captured from a car-mounted camera with an optical correlation system, to give the driver a warning depending on the distance and speed of the vehicle; a system in which a predetermined position relative to a "road region" in an image is searched to recognize a sign; a system in which the output of a camera embedded in a door mirror or a side mirror is displayed on an image display device placed near the driver's seat in the car; a system in which the situation of an oncoming vehicle and the situation of an adjacent lane can be easily checked; and a system in which blind-spot images on the right and left sides and an image below the vehicle are simultaneously taken and displayed.

The systems as described above must not be susceptible to weather conditions. For example, in a prior art technology disclosed in Japanese Laid-Open Patent Publication No. 5-294183, a half mirror is used for a mirror portion of a door mirror of a vehicle, and an optical filter-equipped video lens and an imaging device such as a CCD are provided inside the half mirror. A camera signal processing circuit placed inside the vehicle processes a video signal and outputs the results to an image display device. In this way, a car-mounted imaging device unsusceptible to weather conditions is realized.

There are problems as follows in relation to the position at which a camera is mounted. That is, (1) placement of a camera inside a car may cause disfigurement, degrade the comfort and narrow the vision of the driver, (2) placement of a camera in an engine compartment may cause a failure because the surrounding environment is very hostile, and (3) placement of a camera on the side of a door or on an engine compartment may adversely affect the safety, the design and the performance such as aerodynamic drag. The above prior art technology is free from these problems on the camera mounting position.

While the prior art technology described above permits a camera to be mounted at a position where no vehicle performance is degraded, it disadvantageously restricts the performance of a camera. That is, the following problems arise: (1) the sensitivity of the camera deteriorates because the camera takes images of the outside through a half mirror; (2) the vision range allowed to be imaged is limited, despite of efforts made for the orientation and viewing angle of the camera, because the camera mounting position is inside a door mirror; and (3) while omission of door mirrors is now under examination, this technology is not ready for this omission.

The inside of a door mirror may be a good environment compared with the outer surface of a vehicle and the inside of an engine compartment. However, as is well known, the temperature inside a vehicle, including inside its door mirror, parked under the hot sun in the midsummer becomes very high. Inside an engine compartment, also, the temperature becomes far high during driving compared with inside the vehicle. When a camera is mounted on the outer surface of the vehicle, a use environment problem of the camera being exposed to direct sunlight occurs.

Conventional color filters are made of pigments of organic materials. If being left in a high-temperature state for a long time or exposed to intense incident light for a long time, therefore, the pigments may be subjected to a chemical change causing a change in wavelength selection characteristics. In other words, in the prior art imaging device using pigment filters, discoloring (degradation in color separation characteristics) occurs due to high temperature or high irradiation. For this reason, placement of a camera on the outer surface of a vehicle, inside a vehicle and inside an engine compartment causes a problem that the color reproducibility may deteriorate under the influence of the ambient temperature and direct sunlight.

Contrarily to the above, use of pigments of inorganic materials overcomes the problem of the pigments being discolored due to a chemical change, and thus no problem will arise in the use under high temperature or high irradiation. Such a camera can therefore be mounted anywhere, including on the outer surface of a vehicle, inside a vehicle and inside an engine compartment, as a car-mounted camera.

However, filters made of inorganic materials have a problem that, in color separation in the red (R), green (G) and blue (B) wavelength bands, the transmission band is narrow in spectral characteristics on the low-wavelength side, compared with filters of organic materials. To address this problem, the noise reduction effect may be intensified in image processing to enhance the color reproducibility. This however causes another problem of worsening the S/N of color signals.

SUMMARY OF THE INVENTION

An object of the present invention is providing an imaging device that causes no discoloring under high temperature or high irradiation and has high color reproducibility.

The imaging device of the present invention is an imaging device including an image sensor having a plurality of unit pixels arranged on a chip. The imaging sensor includes, for each unit pixel: a photoelectric conversion element for photoelectrically converting incident light; and a filter placed above the photoelectric conversion element for selectively transmitting only wavelengths of part of the incident light. The filters are multilayer filters formed of inorganic materials, and the filters include at least red filters for selectively transmitting a wavelength band belonging to red, green filters for selectively transmitting a wavelength band belonging to green, and first and second blue filters for selectively transmitting a wavelength band belonging to blue, transmission peak wavelengths of the first and second blue filters being different from each other.

According to the present invention, since a multilayer filter formed of inorganic materials is used as each filter, the problem of discoloring due to a chemical change in pigment described above is solved. Thus, with no problem occurring in use under high temperature or high irradiation, the imaging device can be mounted, as a car-mounted device, at any place of a vehicle including on the outer surface of the vehicle, inside the vehicle and in the engine compartment of the vehicle.

First and second blue filters different in peak wavelength from each other are used as blue filters selectively transmitting a wavelength band belonging to blue. This can compensate the property that the transmission band in the low wavelength region is narrow compared with filters made of organic materials, and thus can improve the color reproducibility.

As described above, according to the present invention, use under high temperature or high irradiation is permitted, and the color reproducibility is improved. Thus, an imaging device free from discoloring due to high temperature or high irradiation and having high color reproducibility can be provided.

DESCRIPTION OF THE PREFERRED EMBODIMENTS

Hereinafter, preferred embodiments of the present invention will be described with reference to the accompanying drawings.

Figure 1:
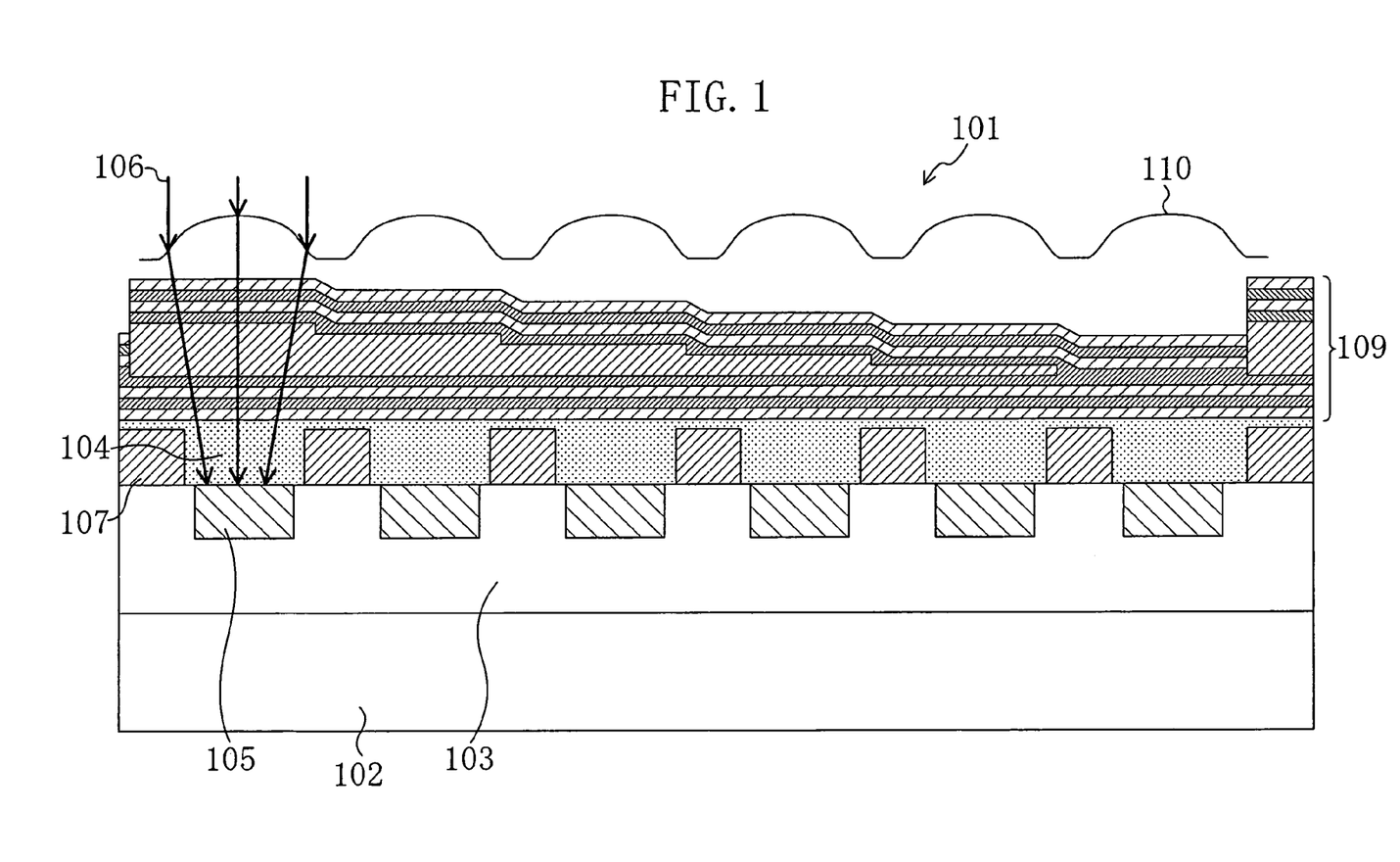
FIG. 1 is a cross-sectional view showing a structure of an image sensor of an imaging device of an embodiment of the present invention.

FIG. 1 is a cross-sectional view showing a structure of an image sensor of an imaging device of an embodiment according to the present invention. As shown in FIG. 1, in an image sensor 101, an n-type layer 102 and then a p-type layer 103 are formed in a silicon semiconductor substrate, and an interlayer insulating film 104 is formed on the p-type layer 103. Photodiodes (photoelectric conversion elements) 105 are formed in the p-type layer 103 by ion implantation of an n-type impurity. The photodiodes 105, which respectively correspond to unit pixels of the image sensor 101, photoelectrically convert incident light 106. The photodiodes 105 are isolated from one another with isolation regions 107.

Multilayer filters 109 made of dielectrics are formed on a light-shading film (not shown) formed to suppress light from being incident on the isolation regions 107, for attaining a wavelength selection function. Condensing lenses 110 are formed over the multilayer filters 109, to efficiently condense the incident light 106. In other words, the image sensor in this embodiment has a plurality of unit pixels arranged on a chip, and each unit pixel includes a photoelectric conversion element for photoelectrically converting incident light and a filter placed above the photoelectric conversion element for selectively transmitting only wavelengths of part of the incident light.

Figure 2:
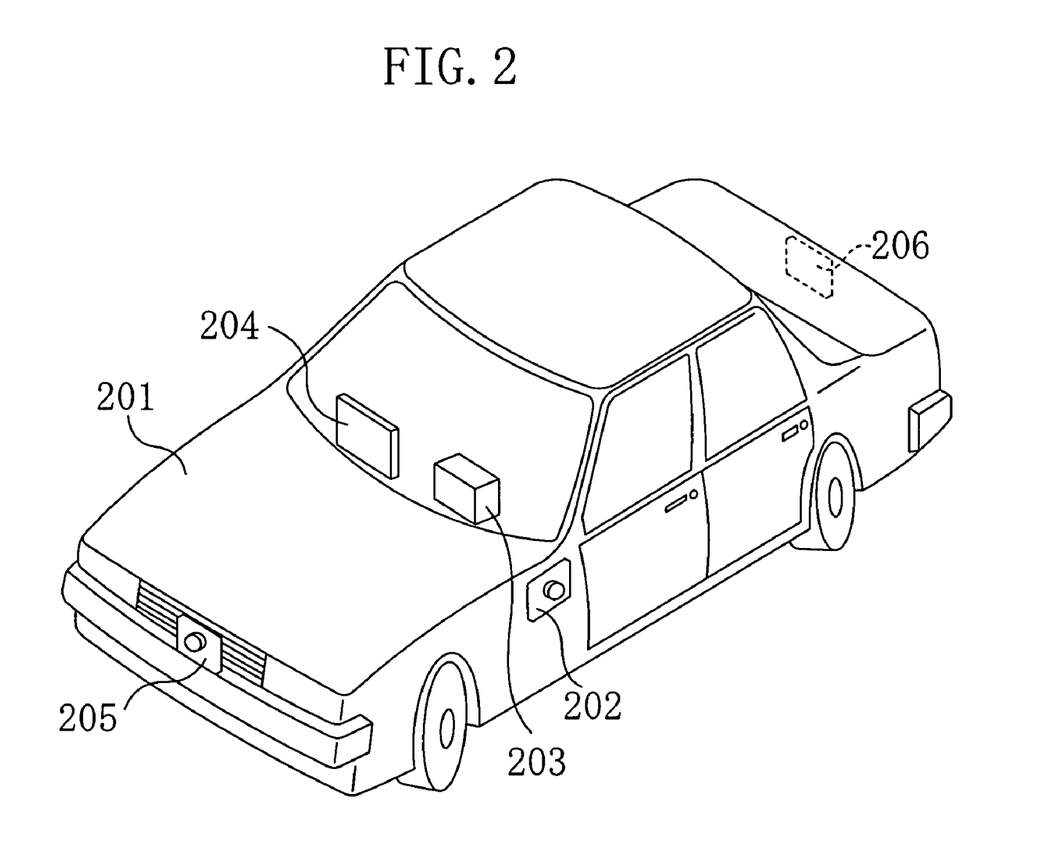
FIG. 2 is a diagrammatic view showing an example of mounting of an imaging device of an embodiment of the present invention to a car.

FIG. 2 is a diagrammatic view showing an example of mounting of an imaging device of an embodiment of the present invention to a car. A car 201 has neither a fender mirror nor a door mirror, but instead has a side camera 202. A video signal from the side camera 202 is supplied to a video control device 203 placed in a console of the car, and an output signal from the video control device 203 is displayed on a video display device 204 placed near the driver's seat in the car.

A front camera 205 and a rear camera 206 are also placed on the car 201, and video signals from these cameras are also supplied to the video control device 203. The video control device 203 displays the video signals from the side camera 202, the front camera 205 and the rear camera 206 on the video display device 204 individually by switching or simultaneously. The image sensor shown in FIG. 1 is incorporated in each of the side camera 202, the front camera 205 and the rear camera 206.

Cameras are likely to be protected in the event of an accident such as a crash when they are placed inside a vehicle or in an engine compartment, compared with when they are on the outer surface of the vehicle. In consideration of this, cameras may be placed inside a vehicle or in the engine compartment of the vehicle for monitoring outside the vehicle. This is effective in particular when a camera is used as a car-mounted black box that records images before, during and after a traffic accident.

Referring to FIGS. 3A to 3D, the multilayer filters of the image sensor shown in FIG. 1 will be described.

Figure 3A:
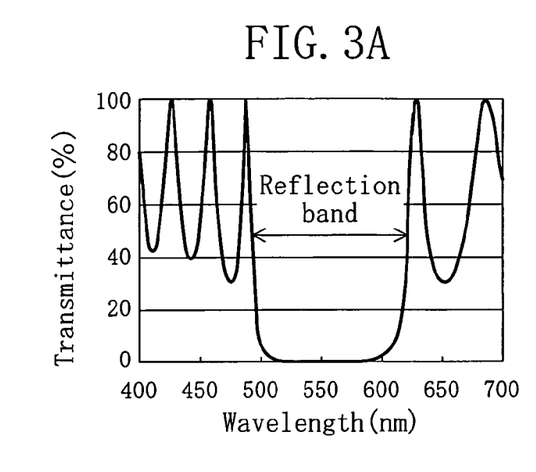
FIGS. 3A and 3B show transmittance characteristics and a layer structure, respectively, of a conventional multilayer reflecting mirror.
Figure 3B:
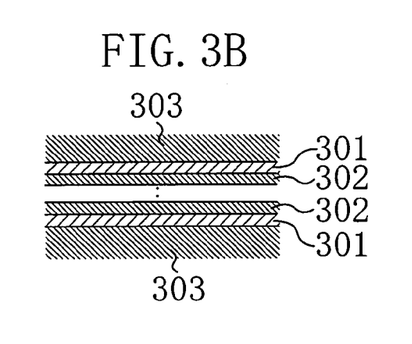

FIGS. 3A and 3B show an example of transmittance characteristics and a layer structure, respectively, of a multilayer reflecting mirror used for a conventional high reflection mirror. The layer structure of FIG. 3B is a simple stack of silicon nitride (SiN) 301 and silicon oxide ($SiO_2$) 302 and 303.

In FIG. 3A, the y-axis represents the transmittance (%), that is, the ratio of light that has passed through the multilayer film to incident light, and the x-axis represents the wavelength (nm) of light incident on the multilayer film (this also applies to graphs to follow). Note that the calculation was made by a matrix method using Fresnel coefficients, in which the number of pairs was 10, the set center wavelength was 550 nm, and only vertical incident light was used for the calculation. The optical thickness nd (n: refractive index of material, d: film thickness of material) of the dielectrics constituting the multilayer film was set at a quarter ($\lambda/4$) of the set center wavelength ($\lambda$). As a result, exhibited are reflection band characteristics having the set center wavelength at the center. The reflection bandwidth is determined by the difference in refractive index between materials used. As the difference in refractive index is greater, the bandwidth is greater. In such a configuration, however, while a wide reflection band is obtained, it will be difficult to secure selective transmission of wavelengths to attain the RGB color separation function.

Figure 3C:
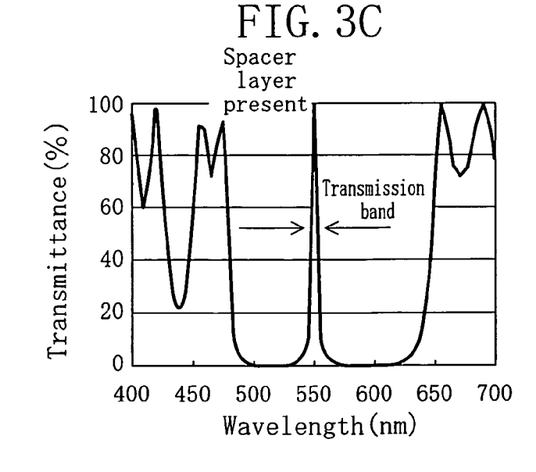
FIGS. 3C and 3D show transmittance characteristics and a layer structure, respectively, of a multilayer filter in an embodiment of the present invention.
Figure 3D:
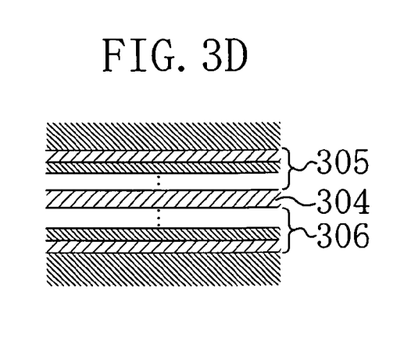

On the contrary, FIGS. 3C and 3D show an example of transmittance characteristics and a layer structure, respectively, of a multilayer filter in an embodiment of the present invention. In the layer structure of FIG. 3D, an upper reflector 305 and a lower reflector 306 both made of λ/4 films face each other symmetrically with a spacer layer 304 therebetween. With this configuration, as shown in FIG. 3C, a transmission band is selectively formed in a reflection band. Also, by changing the thickness of the spacer layer 304, the transmission peak wavelength can be changed.

In other words, in this embodiment, the upper and lower reflectors having the same layer structure are provided as the filter structure, and the transmission band is changed with presence/absence of a spacer layer interposed therebetween or the optical thickness of the spacer layer if any. Having such a filter structure, filters different in characteristics can be easily formed on the same chip. Also, by adopting such a filter structure, the number of process steps can be reduced in a semiconductor wafer process for fabricating the imaging device, and this provides an advantage of permitting inexpensive mass-production of imaging devices.

Figure 4A:
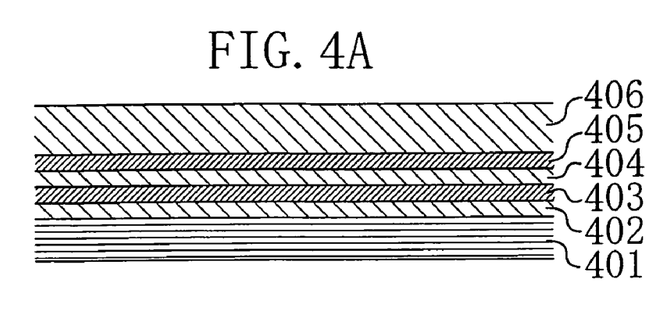
FIGS. 4A to 4D are views showing fabrication process steps for multilayer filters in an embodiment of the present invention.
Figure 4B:
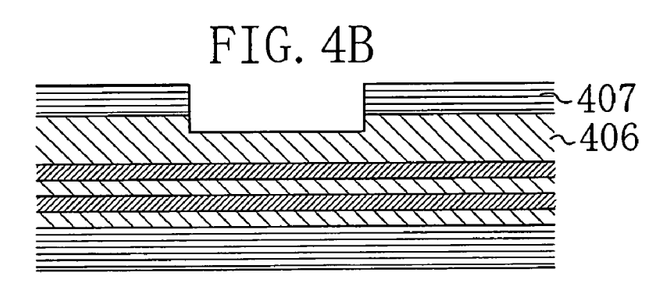
Figure 4C:
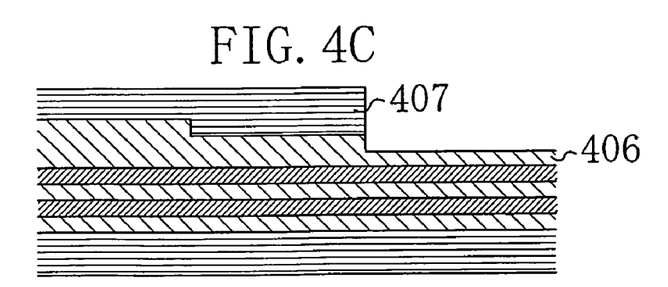
Figure 4D:
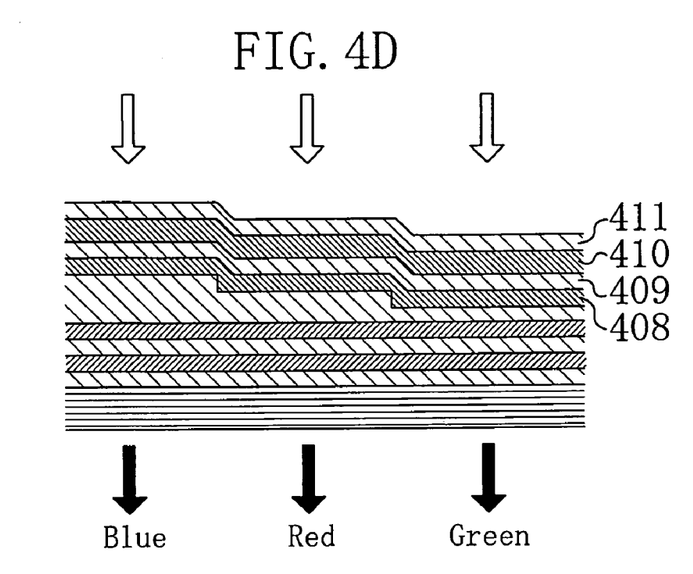

Referring to FIGS. 4A to 4D, a process of forming dielectric multilayer filters will be described. Note that in FIGS. 4A to 4D, only dielectric multilayer filters are extracted and shown. First, as shown in FIG. 4A, lower reflector layers 402 to 405 of a λ/4 multilayer structure (λ: set center wavelength) made of silicon oxide ($SiO_2$) and titanium oxide ($TiO_2$), and a spacer layer 406 made of $TiO_2$ are formed on a Si wafer 401 with a high-frequency sputtering apparatus. Thereafter, the spacer layer 406 is etched to a desired thickness to allow only a specific wavelength to be selectively transmitted. To state more specifically, as shown in FIG. 4B, a resist is applied over the wafer surface on which the lower reflector layers 402 to 406 are formed. After pre-exposure baking (pre-baking), the resist is exposed to light with an exposing apparatus such as a stepper, developed and then subjected to final baking (post-baking), to form a resist pattern 407. The spacer layer 406 is then etched using CF4-base etching gas until a film thickness corresponding to the red (R) wavelength band, for example, is obtained. Likewise, in the manner described with reference to FIG. 4B, a resist pattern is formed to give a region corresponding to the green (G) wavelength band, and the spacer layer 406 is etched by dry etching until a film thickness corresponding to green is left behind (see FIG. 4C). Thereafter, as shown in FIG. 4D, as in FIG. 4A, upper reflector layers 408 to 411 of a λ/4 multilayer film structure made of $SiO_2$ and $TiO_2$ are formed with the high-frequency sputtering apparatus.

The total film thicknesses of the multilayer structure made of dielectrics for R, G and B are 622 nm, 542 nm and 562 nm, respectively.

Figure 5:
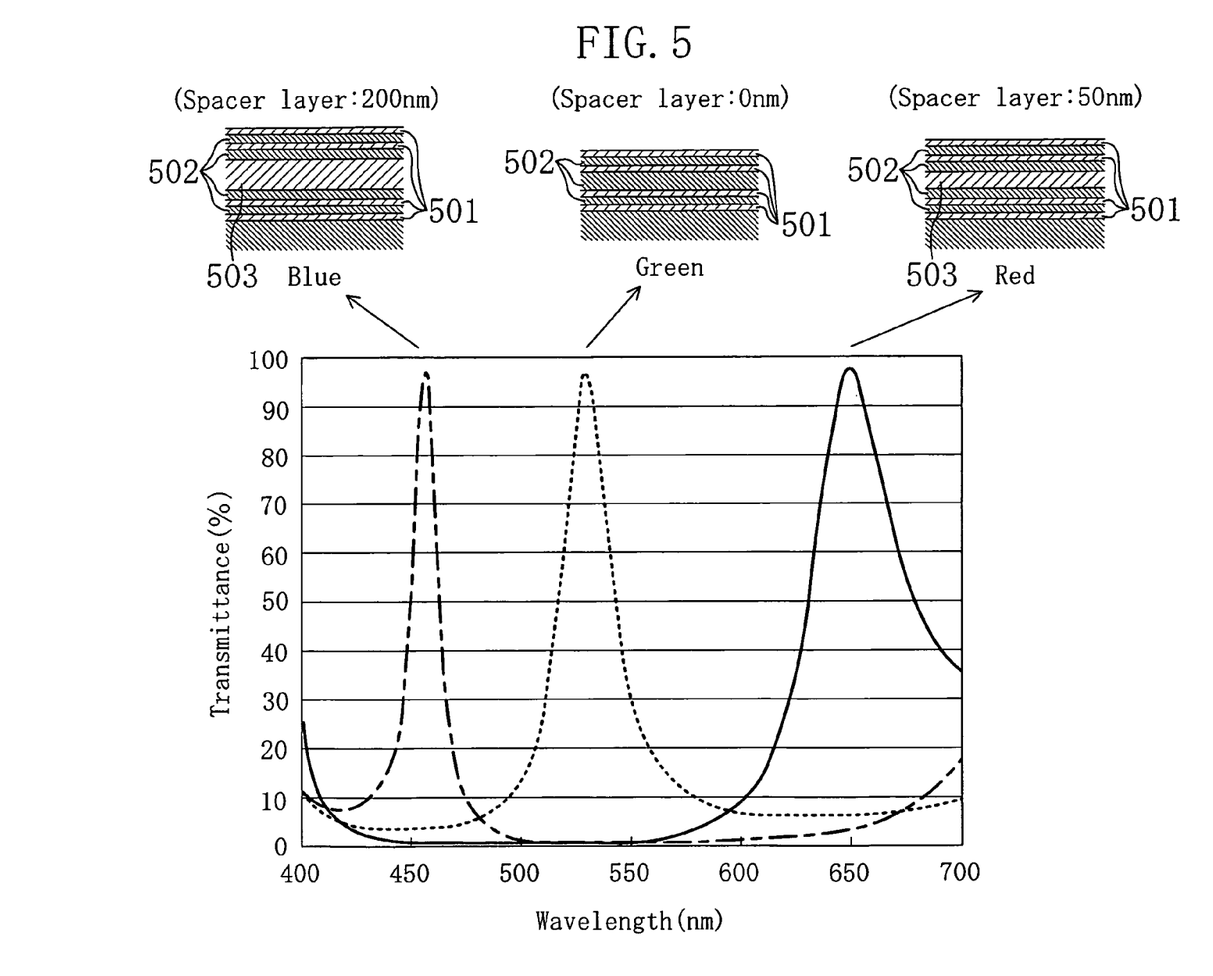
FIG. 5 shows cross-sectional views of multilayer filters in an embodiment of the present invention, and calculation results of the transmittances of the multilayer filters.

FIG. 5 shows an example of design results of spectral characteristics of dielectric multilayer filters calculated by a known characteristic matrix method. In this example, $TiO_2$ 501 as a high refractive index material (refractive index 2.5) and $SiO_2$ 502 as a low refractive index material (refractive index 1.45) were used as the dielectric materials. In FIG. 5, also, the optical thickness (physical thickness) of a spacer layer 503 was changed to 200 nm (80 nm), 0 nm (0 nm) and 50 nm (20 nm). From FIG. 5, it is found that the transmission peak wavelength characteristics can be changed with presence/absence of the spacer layer 503 or with a change of the thickness thereof, and thus RGB wavelength separation, required for an imaging device, can be attained.

Although $TiO_2$ was used as the high refractive index material in FIG. 5, other materials such as silicon nitride (SiN), tantalum oxide ($Ta_2O_5$) and zirconium oxide ($ZrO_2$) may be used. Likewise, although $SiO_2$ was used as the low refractive index material, a material other than $SiO_2$ may be used as long as it is lower in refractive index than a dielectric used as the high refractive index material.

Conventional pigment filters must be formed by a process different from a normal semiconductor process, that is, by a so-called on-chip process, after formation of a light receiving section and an interconnect section of the imaging device. By adopting the dielectric multilayer structure described above, however, the filters can be formed by the normal semiconductor process. This is advantageous for stabilization of the process and cost reduction associated with improvement in productivity.

Moreover, the dielectric multilayer filters can be formed of only inorganic materials and thus are free from a discoloring phenomenon even in use under high temperature or high irradiation. For this reason, when used for car mounting, the dielectric multilayer filters can be placed anywhere, including on the outer surface of a vehicle, inside an engine compartment and inside a vehicle.

Figure 6:
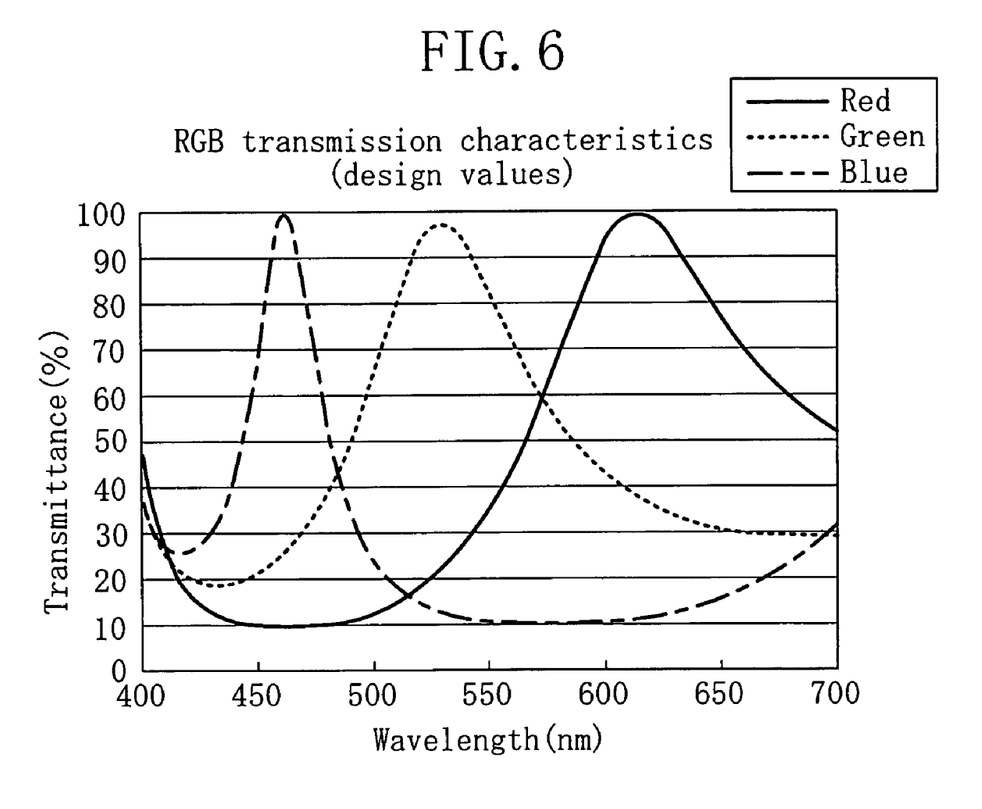
FIG. 6 is a view showing the transmittances of multilayer filters.
Figure 7:
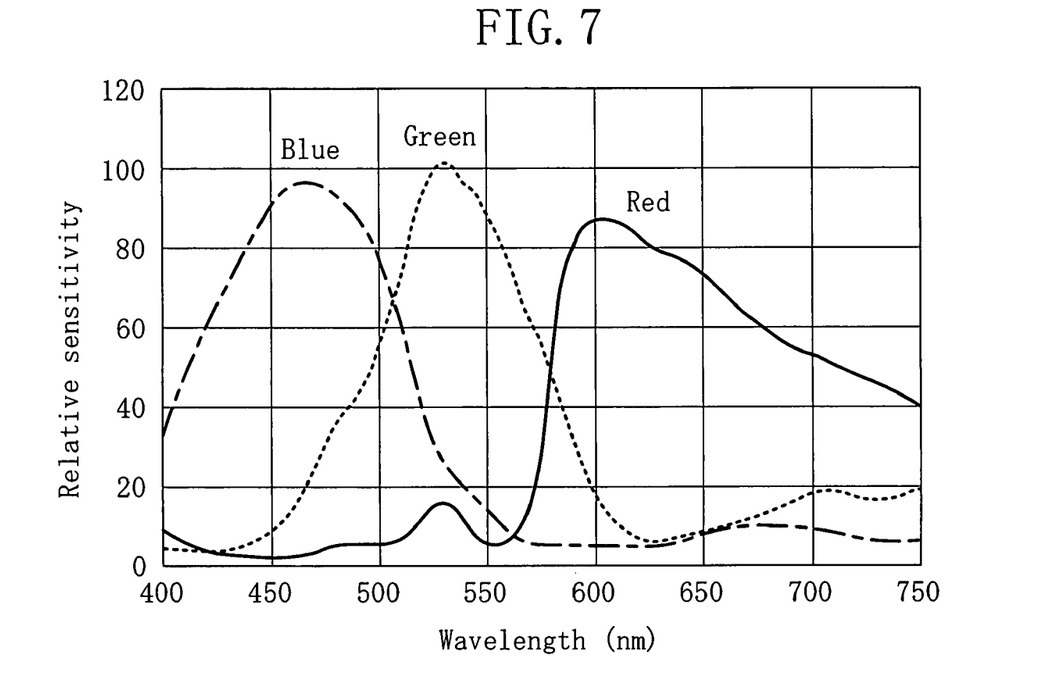
FIG. 7 is a view showing the transmittances of conventional filters.

FIG. 6 shows spectral characteristics of dielectric multilayer filters. FIG. 7 shows currently-available idealistic spectral characteristics in the human visible wavelength range (400 nm to 700 nm).

As is found from comparison of FIG. 6 with FIG. 7, the dielectric multilayer filters are poor in spectral characteristics and low in modulation factor, and thus have not succeeded in securing idealistic color reproduction and color signal S/N. Among others, the spectral characteristics of blue (B) are recognized narrow compared with its idealistic spectral characteristics. If the spectral characteristics are narrow, intense noise reduction may be performed in an image processing section to widen the reproduction range. With this processing, however, it is difficult to secure idealistic color reproduction and color signal S/N.

In view of the above, according to the present invention, two kinds of filters different in transmission peak wavelength are used as blue filters that selectively transmit a wavelength band belonging to blue.

Figure 8:
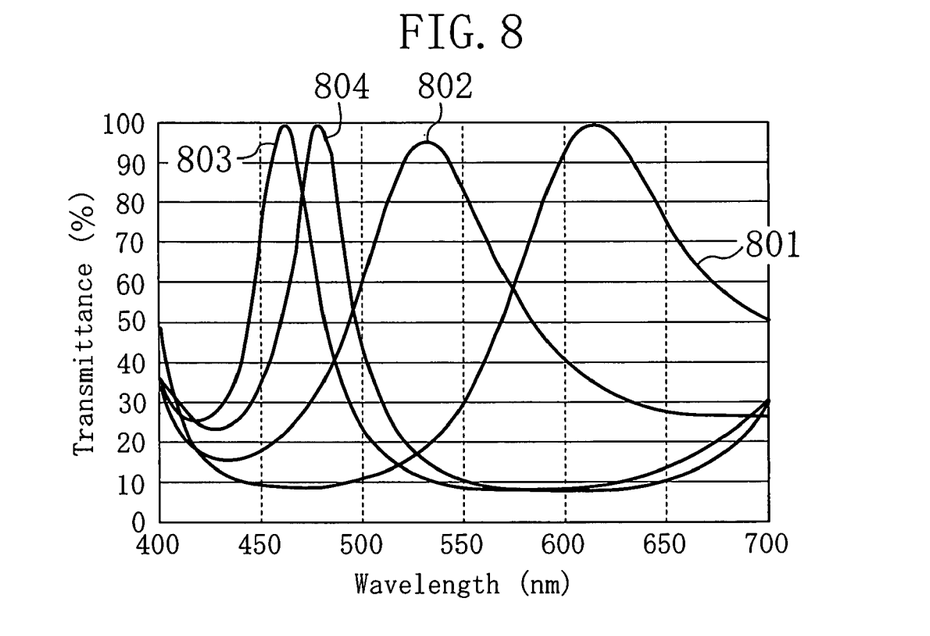
FIG. 8 is a view showing spectral characteristics of a filter configuration in an embodiment of the present invention.

FIG. 8 shows spectral characteristics of filters formed in an image sensor of an embodiment of the present invention. In FIG. 8, the reference numeral 801 denotes spectral characteristics of a red filter that selectively transmits a wavelength band (600 nm to 700 nm) belonging to red, 802 denotes spectral characteristics of a green filter that selectively transmits a wavelength band (500 nm to 600 nm) belonging to green, and 803 and 804 denote spectral characteristics of first and second blue filters that selectively transmit a wavelength band (400 nm to 500 nm) belonging to blue. The image sensor of this embodiment includes red filters, green filters and first and second blue filters respectively exhibiting the spectral characteristics 801 to 804 of FIG. 8.

The spectral characteristics 803 and 804 are different in transmission peak wavelength. The difference in transmission peak wavelength is preferably 10 nm or more and less than 80 nm, although the transmission peak wavelengths are both within the wavelength band (400 nm to 500 nm) belonging to blue.

The characteristics of blue filters in conventional color filters should desirably be reproduced with the first and second blue filters having the spectral characteristics 803 and 804. In this embodiment, therefore, the first and second blue filters preferably have their peak wavelengths in the range of 450 nm to 480 nm and have a difference in peak wavelength of 20 nm or more and less than 30 nm. The first and second blue filters satisfying these conditions are considered optimum in reproduction of the spectral characteristics of the currently-available color filters.

FIGS. 9A, 9B, 10A and 10B are views showing examples of filter arrangements in this embodiment. In FIGS. 9A, 9B, 10A and 10B, R represents a red filter having the spectral characteristics 801 in FIG. 8, G represents a green filter having the spectral characteristics 802 in FIG. 8, B1 represents a first blue filter having the spectral characteristics 803 in FIG. 8, and B2 represents a second blue filter having the spectral characteristics 804 in FIG. 8.

Figure 9A:
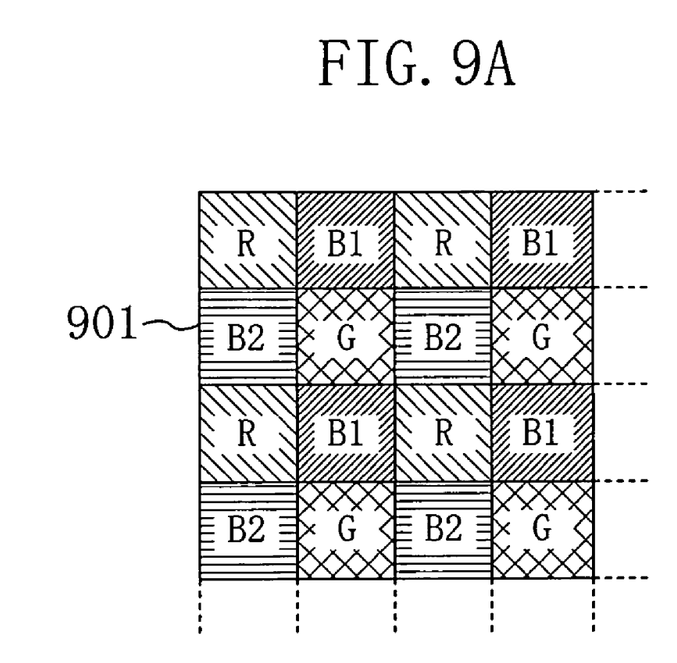
FIGS. 9A and 9B are views showing filter arrangements in an embodiment of the present invention.
Figure 9B:
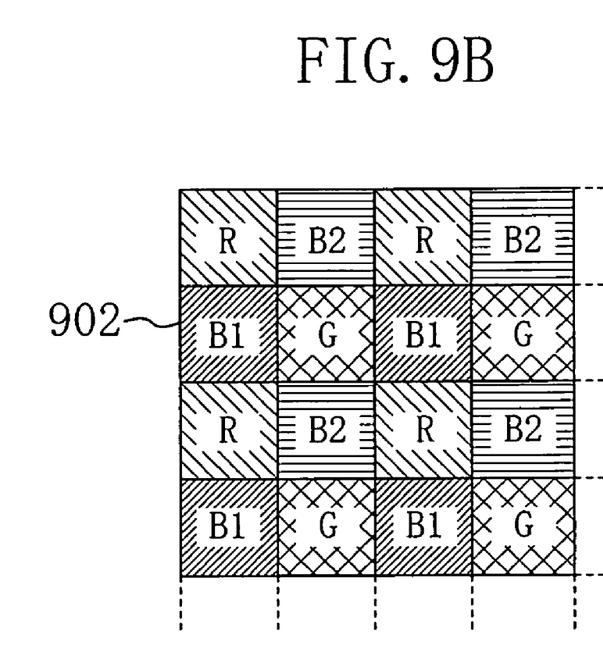

In filter arrangements 901 and 902 in FIGS. 9A and 9B, 2×2 matrixes each having each one of the filters R, G, B1 and B2 are arranged continuously in the vertical and horizontal directions. In the illustrated examples, the numbers of the filters R, the filters B1, the filters B2 and the filters G are equal to one another. In filter arrangements 1001 and 1002 in FIGS. 10A and 10B, the filters G are placed in a zigzag pattern, and the filters R, B1 and B2 are placed at the remaining positions. In these examples, the number of the filters R and the total number of the filters B1 and B2 are equal to each other, and are individually smaller than the number of the filters G.

The human visibility is highest for a green component, and thus green information is most contributive to the sharpness. Also, the human eyes are sensitive to the horizontal/vertical resolution and comparatively insensitive to the diagonal resolution. Therefore, the zigzag arrangement of the green filters is effective in enhancing the sharpness. It is also effective in enhancing the sharpness to place the blue filters in a larger number than the red filters and the blue filters. Further, the arrangement of the blue filters and the red filters in equal proportions is effective in enhancing the color reproducibility.

Figure 10A:
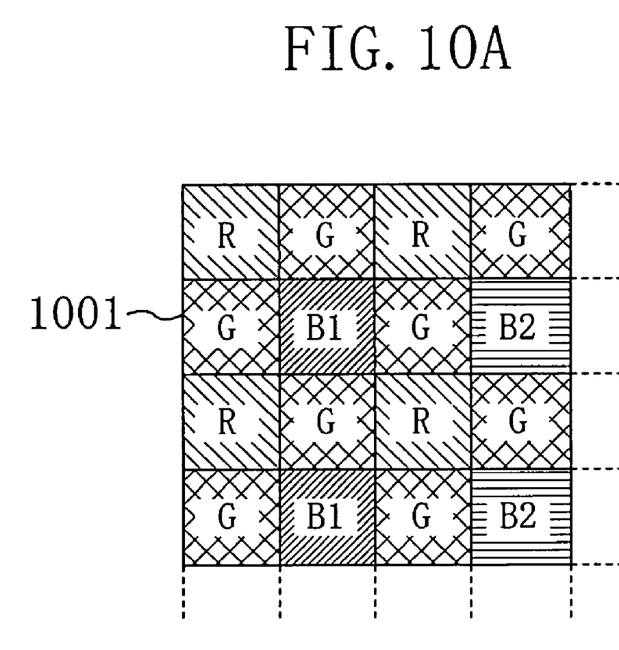
FIGS. 10A and 10B are views showing other filter arrangements in an embodiment of the present invention.
Figure 10B:
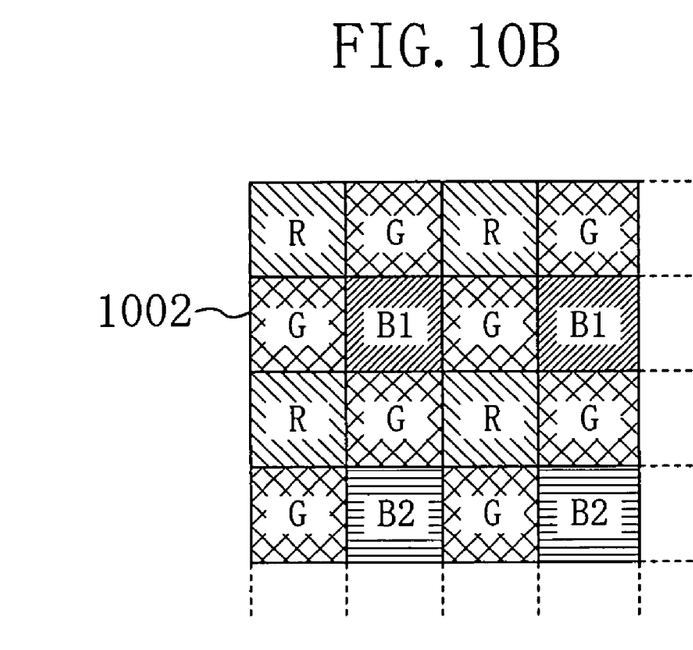

Accordingly, the filter arrangements 1001 and 1002 in FIGS. 10A and 10B in which the filters G are arranged in a zigzag pattern and the filters B1 and B2 are arranged so that the total number thereof is equal to the number of the filters R are more effective in enhancing the sharpness and also enhancing the color reproducibility than the filter arrangements 901 and 902 in FIGS. 9A and 9B in which the filters R, G, B1 and B2 are arranged uniformly.

More specifically, in this embodiment, the following arrangement is recommended. That is, a 2×4 matrix or a 4×2 matrix constitutes one unit, in which four G filters are arranged in a zigzag pattern and two R filters, one B1 filter and one B2 filter are placed at the remaining positions so that no filter is adjacent to the same kind of filter. Such 2×4 matrixes or 4×2 matrixes are arranged continuously in the vertical and horizontal directions. Note that this is merely an example of ideas of basic filter arrangement and any other arrangement may be adopted.

Figure 11:
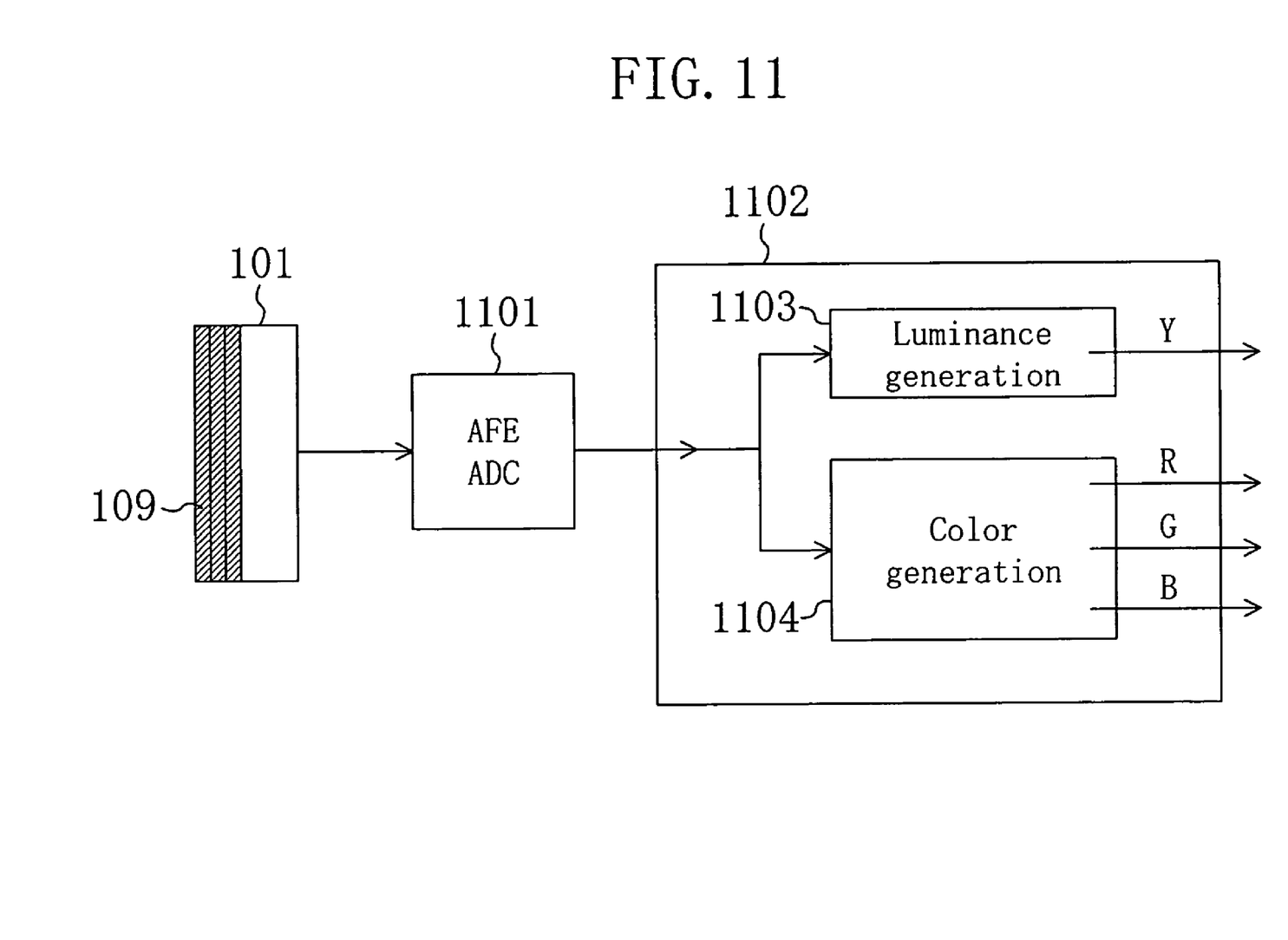
FIG. 11 is a view showing the entire configuration of an imaging device of an embodiment of the present invention.

FIG. 11 shows the entire configuration of an imaging device of an embodiment of the present invention. In FIG. 11, the imaging device includes the above-described image sensor 101 having the multilayer filters 109 made of inorganic materials, an analog front end (AFE)/AD converter (ADC) 1101 and an image processing section 1102. The AFE/ADC 1101 performs analog processing for an output signal of the image sensor 101, converts the processed signal to a digital signal and outputs the resultant signal as a video signal. The image processing section 1102 processes the video signal outputted from the AFE/ADC 1101 to generate desired image data. The image processing section 1102, which is implemented by LSI, for example, includes a luminance signal generation block 1103 for generating a luminance signal from the video signal and a color signal generation block 1104 for generating color signals from the video signal. Note that although the generated color signals are based on the three primary colors (R, G and B), other color signal schemes such as that using color difference signals (U and V) may be adopted.

Assume herein that the image sensor 101 has such a configuration that four kinds of filters as described above are placed continuously in the form of a matrix of n×q (n and q are integers equal to or more than 2) as a basis. Assume also that the color signal generation block 1104 performs processing of generating a color signal at the centroid of an m×p (m and p are integers equal to or more than 2) matrix for the video signal using m×p matrix processing continuously while shifting the position of the centroid of the m×p matrix by one pixel at a time in the horizontal and vertical directions. Likewise, assume that the luminance signal generation block 1103 performs processing of generating a luminance signal at the centroid of an m×p matrix for the video signal using m×p (m and p are integers equal to or more than 2) matrix processing continuously while shifting the position of the centroid of the m×p matrix by one pixel at a time in the horizontal and vertical directions. Note that no deviation in centroid is assumed to exist at the time of final superimposition of the luminance signal and the color signal on each other.

Figure 12:
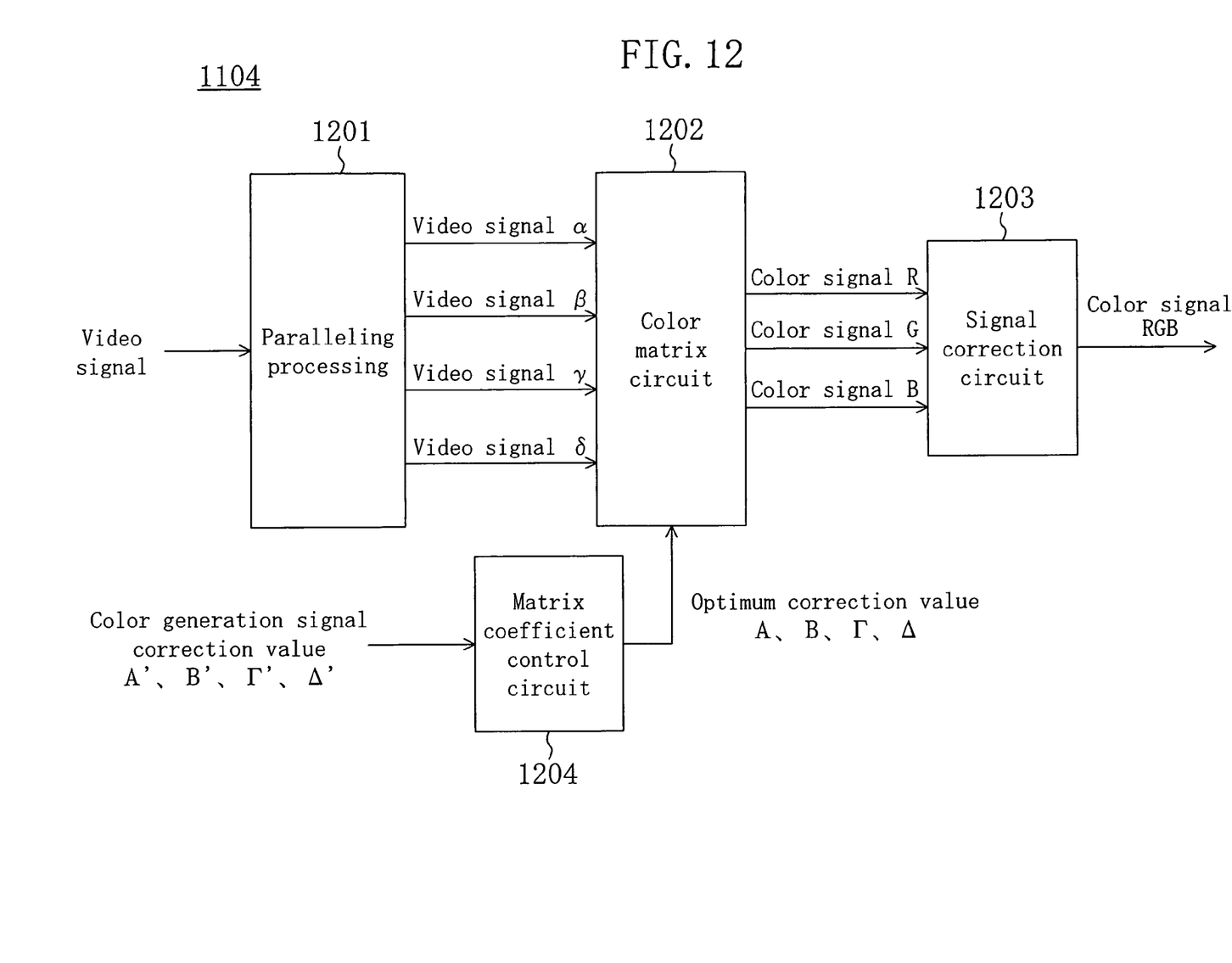
FIG. 12 is a view showing a circuit configuration of a color signal generation block in FIG. 11.

FIG. 12 is a block diagram of a circuit configuration of the color signal generation block 1104. Assume herein that the multilayer filters 109 of the image sensor 101 are arranged as shown in FIGS. 9A and 9B or FIGS. 10A and 10B, and the video signal digitized by the AFE/ADC 1101 is inputted into the color signal generation block 1104.

A paralleling circuit 1201 performs paralleling for the video signal inputted in time series, to generate digital video signals of color components $\alpha$, $\beta$, $\gamma$ and $\delta$. The video signals $\alpha$, $\beta$, $\gamma$ and $\delta$ as used herein are signals having passed through the red (R), green (G), first blue (B1) and second blue (B2) dielectric multilayer filters having the respective spectral characteristics shown in FIG. 8. A matrix coefficient control circuit 1204 generates correction values A, B, $\Gamma$ and $\Delta$ optimized for correction of output signals of a color matrix circuit 1202 from inputted predetermined color generation signal correction values A', B', $\Gamma$' and $\Delta$', based on the spectral characteristics of the respective filters through which the video signals $\alpha$, $\beta$, $\gamma$ and $\delta$ have passed. It is herein assumed that the matrix coefficient control circuit 1204 dynamically determines to which one of the video signals $\alpha$, $\beta$, $\gamma$ and $\delta$ each of the m×p signal components of the input signal as the object to be processed corresponds, and multiplies the inputted predetermined color generation signal correction values A', B', $\Gamma$' and $\Delta$' by coefficients generated based on the corresponding spectral characteristics, to generate the correction values A, B, $\Gamma$ and $\Delta$. The color matrix circuit 1202 multiplies the video signals $\alpha$, $\beta$, $\gamma$ and $\delta$ by the optimized correction values A, B, $\Gamma$ and $\Delta$, and then sums up the multiplied results, to obtain a signal of a centroid pixel of the matrix, as expressed by Equation (1) below.

$$(\text{Output}) = (A*\alpha) + (B*\beta) + (\Gamma*\gamma) + (\Delta*\delta) \tag{1}$$

Note that the matrix coefficient control circuit 1204 is assumed to be able to change the correction values (color matrix coefficients) based on the signal matrix configuration at the time of inputting and the spectral characteristics of the filters through which the video signals $\alpha$, $\beta$, $\gamma$ and $\delta$ have passed.

The value of the output in Equation (1) corresponds to the color signals R, G and B outputted from the color matrix circuit 1202. Equation (2) below is therefore obtained from the relationship between Equation (1) and the signals outputted from the color matrix circuit 1202.

$$(R) = (A_R * \alpha) + (B_R * \beta) + (\Gamma_R * \gamma) + (\Delta_R * \delta)$$

$$(G) = (A_G * \alpha) + (B_G * \beta) + (\Gamma_G * \gamma) + (\Delta_G * \delta)$$

$$(B) = (A_B * \alpha) + (B_B * \beta) + (\Gamma_B * \gamma) + (\Delta_B * \delta) \qquad (2)$$

where $A_R$, $A_G$ and $A_B$ are coefficients by which the video signal $\alpha$ is multiplied to output R, G and B, respectively, $B_R$, $B_G$ and $B_B$ are coefficients by which the video signal $\beta$ is multiplied to output R, G and B, respectively, $\Gamma_R$, $\Gamma_G$ and $\Gamma_B$ are coefficients by which the video signal $\beta$ is multiplied to output R, G and B, respectively, and $\Delta_R$, $\Delta_G$ and $\Delta_B$ are coefficients by which the video signal $\delta$ is multiplied to output R, G and B, respectively.

Note that the matrix coefficient control circuit 1204 is assumed to determine which one of the video signals $\alpha$, $\beta$, $\gamma$ and $\delta$ as the inputs of the color matrix circuit 1202 is the centroid of the matrix to be processed, to differentiate the video signal at the centroid from neighboring pixels. Based on this determination, the matrix coefficient control circuit 1204 is assumed to multiply the inputted predetermined color generation signal correction values A', B', Γ' and Δ' by coefficients based on the pixel proportions in the matrix, to thereby select and output the correction values A, B, Γ and Δ. In this way, it is no more necessary to specify the configuration of the filter arrangement, but color conversion processing based on the spectral characteristics of the filters can be performed even when a change is made for a given filter arrangement.

In the filter arrangement shown in FIGS. 9A and 9B, the four kinds of filters, R, G, B1 and B2, are placed at their fixed positions on a 2×2 matrix. The color matrix circuit 1202 performs processing of generating a color signal for the centroid of a 2×2 matrix as a unit, which includes the four kinds of filters, continuously while shifting the processing start position by one pixel at a time in the horizontal and vertical directions. At this time, the matrix coefficient control circuit 1204 is assumed to select a matrix correction value from the correction values A, B, Γ and Δ set based on the spectral characteristics of the four kinds of filters, based on whether the number of columns and the number of rows of the matrix to be processed are odd or even, and outputs the selected value. The color matrix circuit 1202, receiving the optimum correction values from the matrix coefficient control circuit 1204, performs processing for the video signals $\alpha$, $\beta$, $\gamma$ and $\delta$ using the received optimum correction values. In this way, optimum color signals can be generated. Note that the matrix configuration used for the matrix transformation performed by the color matrix circuit 1202 is not limited but any m×p (m and p are integers equal to or more than 2) matrix may be used.

In the filter configuration shown in FIGS. 10A and 10B, three kinds of filters including two G filters, that is, filters R, G, B1 and G or filters R, G, B2 and G, constitute a 2×2 matrix. The color matrix circuit 1202 performs processing of generating a color signal at the centroid of a 2×2 matrix continuously while shifting the processing start position by one pixel at a time in the horizontal and vertical directions. The color matrix circuit 1202 determines the filter whose characteristics have contributed to the color signal component of the pixel at the centroid of the m×p matrix to be processed. In this case, it must be considered that the color filter component of a pixel signal included in the m×p matrix to be processed may change. The matrix coefficient control circuit 1204 is therefore assumed to perform processing of changing the coefficients for obtaining optimum matrix correction values for neighboring pixels and the centroid pixel required to extract the color component of the centroid pixel, depending on the start position of the m×p matrix, based on the proportions of the filters B1 and B2. Also assumed is that the matrix coefficient control circuit 1204 selects a matrix correction value from the correction values A, B, Γ and Δ based on whether the number of columns and number of rows of the matrix to be processed are odd or even, and outputs the selected value. The color matrix circuit 1202, receiving the optimum correction values from the matrix coefficient control circuit 1204, performs processing for the video signals $\alpha$, $\beta$, $\gamma$ and $\delta$ using the received optimum correction values. In this way, optimum color signals can be generated. Note that the matrix configuration used for the matrix transformation performed by the color matrix circuit 1202 is not limited but any m×p (m and p are integers equal to or more than 2) matrix may be used.

Also, when a plurality of filters having the same spectral characteristics are included on the m×p matrix plane used in the matrix circuit processing, that is, in the range of the object of the m×p matrix processing, it is preferred to use a coefficient capable of giving the weighted average of pixel values corresponding to such filters. With this, the color components of the video signals obtained through the filters having the same spectral characteristics can be averaged, as opposed to color components of video signals obtained from filters having spectral characteristics belonging to different colors.

A signal correction circuit 1203 performs correction processing for the color signals R, G and B outputted from the color matrix circuit 1202. The correction processing performed by the signal correction circuit 1203 includes gamma correction, color correction and the like.

Figure 13:
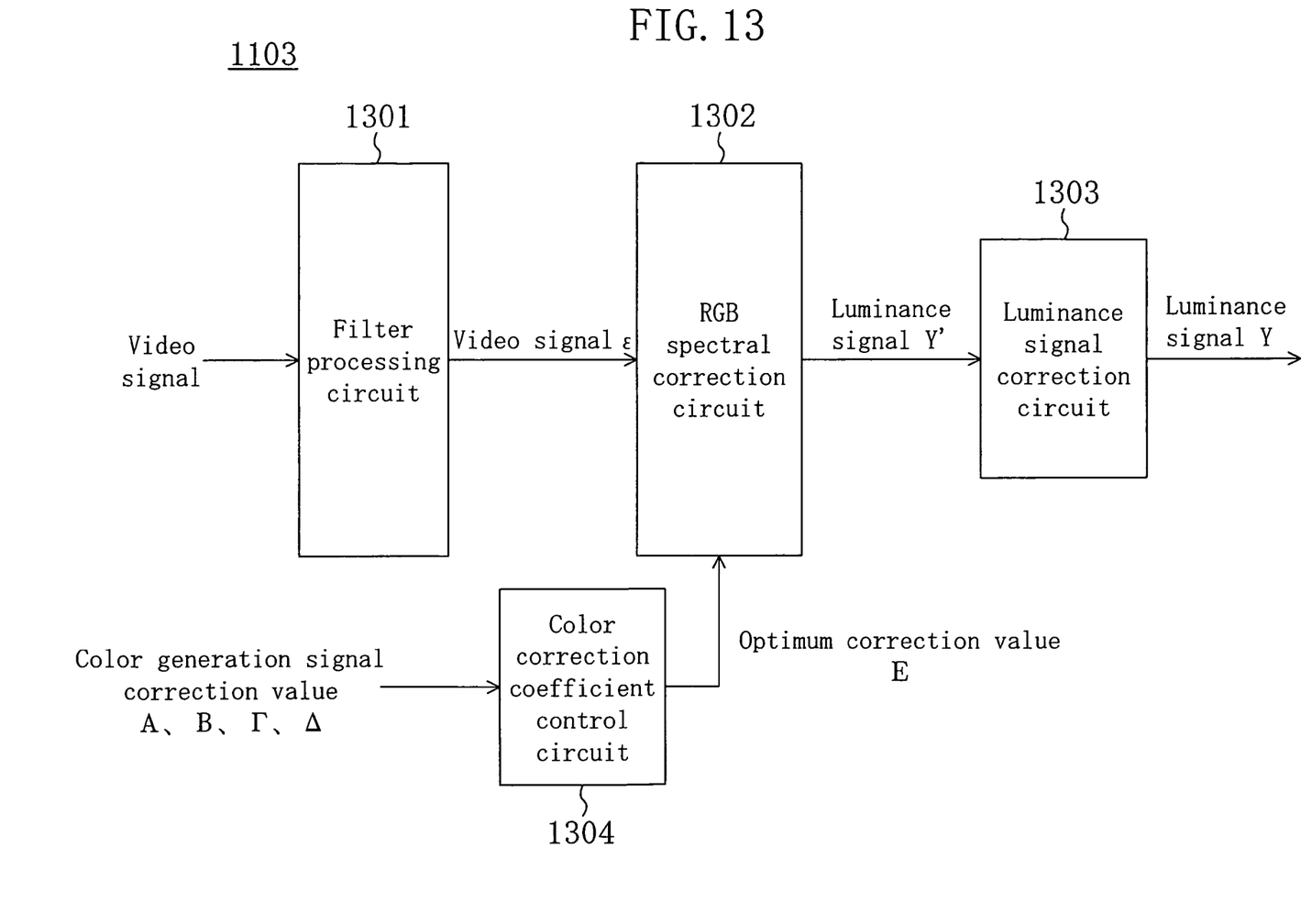
FIG. 13 is a view showing a circuit configuration of a luminance signal generation block in FIG. 11.

FIG. 13 is a block diagram showing a circuit configuration of the luminance signal generation block 1103. Assume herein that the multilayer filters 109 of the image sensor 101 are arranged as shown in FIGS. 9A and 9B or FIGS. 10A and 10B, and the video signal digitized by the AFE/ADC 1101 is inputted into the luminance signal generation block 1103.

A filter processing circuit 1301 has 0 to q (q is any given integer) delay circuits, has a function of processing a plurality (q+1) of 0T to qT adjacent video signals simultaneously, and can process (q+1) adjacent video signals for a plurality (R+1) of 0 to R rows. The filter processing circuit 1301 performs matrix processing according to Equations (3) and (4) below, to output a video signal $\in$ at the centroid of the matrix.

$$\varepsilon_0 = (p_{00} * 0T) + (p_{10} * 1T) + \ldots + (p_{q-1\,0} * q - 1T) + (p_{q0} * qT) \qquad (3)$$

$$\vdots$$

$$\varepsilon_R = (p_{0R} * 0T) + (p_{1R} * 1T) + \ldots + (p_{q-1\,R} * q - 1T) + (p_{qR} * qT)$$

where $p_{00}$, $p_{10}$, ..., $p_{q-1\,0}$, $p_{q0}$ are respectively coefficients by which (q+1) video signals 0T, 1T, 2T, ..., q−1T, qT in the 0-th row are multiplied, and $p_{0R}$, $p_{1R}$, ..., $p_{q-1\,R}$, $p_{qR}$ are respectively coefficients by which (q+1) video signals 0T, 1T, 2T, ..., q−1T, qT in the R-th row are multiplied.

$$(\text{Output } \in) = (\omega_0 \times \in_0) + (\omega_1 \times \in_1) + (\omega_2 \times \in_2) + \ldots + (\omega_{R-1} \times \in_{R-1}) + (\omega_R \times \in_R) \qquad (4)$$

where $\in_0$ to $\in_R$ are the outputs of Equation (3), and $\omega_0$, $\omega_1$, $\omega_2$ ..., $\omega_{R-1}$, $\omega_R$ are given coefficients.

The video signal $\in$ as the output of the filter processing circuit 1301 includes color components that have passed through color filters. A RGB spectral correction circuit 1302 performs correction for the video signal ∈ for minimizing a change due to the color components. A color correction coefficient control circuit 1304 performs dynamic control for the inputted color generation signal correction values A, B, Γ and Δ based on the spectral characteristics of the filters, to generate an optimum correction value E. The RGB spectral correction circuit 1302 corrects the color components included in a luminance signal using the optimum correction value E outputted from the color correction coefficient control circuit 1304. The color generation signal correction values A, B, Γ and Δ are preferably the same as the outputs of the matrix coefficient control circuit 1204. By using the correction coefficients used for the color signal generation also for the luminance signal generation block, most suitable correction is attained.

In the filter configuration shown in FIGS. 9A and 9B, the four kinds of filters, R, G, B1 and B2, are placed at their fixed positions on a 2×2 matrix. The color correction coefficient control circuit 1304 calculates the optimum correction value E for the luminance signal, considering the filter coefficients used in the generation of the video signal ∈ by the filter processing circuit 1301 (coefficients used in Equations (3) and (4); hereinafter referred to as ∈ generation coefficients) and the spectral characteristics of the four kinds of filters. The RGB spectral correction circuit 1302 corrects the RGB characteristics of the video signal ∈ using the optimum correction value E generated by the color correction coefficient control circuit 1304.

In the filter configuration shown in FIGS. 10A and 10B, three kinds of filters including two G filters, that is, filters R, G, B1 and G or filters R, G, B2 and G; are placed in a 2×2 matrix. The filter processing circuit 1301 has a function of generating the ∈ generation coefficients used in generation of the luminance signal by determining the spectral characteristics of the filter for the pixel at the centroid of the matrix, and generates the video signal ∈ using the ∈ generation coefficients. The color correction coefficient control circuit 1304 calculates the optimum correction value E for the video signal ∈ for generating the luminance signal considering the ∈ generation coefficients used by the filter processing circuit 1301 and the spectral characteristics of the filters included in the video signal ∈. The RGB spectral correction circuit 1302 corrects the RGB characteristics of the video signal ∈ using the optimum correction value E generated by the color correction coefficient control circuit 1304.

In the luminance signal generation block, the function of the color correction coefficient control circuit 1304 may be omitted, and the RGB spectral correction circuit 1302 may correct the RGB characteristics using the color generation signal correction values A, B, Γ and Δ, to generate a luminance signal Y. The generated luminance signal Y may be subjected to spectral correction considering the spectral characteristics of the four kinds of filters included in the luminance signal Y, to thereby obtain the final luminance signal. This configuration eliminates the necessity of supplying the correction coefficients generated considering the spectral characteristics of the four kinds of filters to the RGB spectral correction circuit 1302. Therefore, by adding a correction circuit for multiplying the results by coefficients considering the spectral characteristics of the four kinds of filters to the end of a conventional luminance signal generation block (whose configuration is not specified), a luminance signal considering the spectral characteristics of the four kinds of filters can be generated. For effective reflection of the correction considering the spectral characteristics, however, correction using the color correction coefficient control circuit 1304 is preferred.

A luminance signal correction circuit 1303 corrects the output of the RGB spectral correction circuit 1302 to obtain the final luminance signal Y. The luminance signal correction at this stage includes gain correction, offset correction, flow correction and the like.

The imaging device of the present invention is significantly high in reliability and can attain idealistic color reproducibility, and thus is very useful as a car-mounted imaging device that monitors images of surroundings of the car for visual recognition by a person.

While the present invention has been described in preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. An imaging device comprising an image sensor having a plurality of unit pixels arranged on a chip,
    the imaging sensor comprising, for each unit pixel:
        a photoelectric conversion element for photoelectrically converting incident light; and
        a filter placed above the photoelectric conversion element for selectively transmitting only wavelengths of part of the incident light;
    wherein the filters are multilayer filters formed of an inorganic material,
    the filters consist of four types of filters which include a red filter for selectively transmitting a wavelength band belonging to red, a green filter for selectively transmitting a wavelength band belonging to green, and first and second blue filters for selectively transmitting a wavelength band belonging to blue, transmission peak wavelengths of the first and second blue filters being different from each other,
    the difference in transmission peak wavelength between the first and second blue filters is 10 nm or more and less than 80 nm, and
    on the image sensor, the number of the red filters is equal to the total number of the first and second blue filters; the number of the red filters is less than the number of green filters; and the total number of the first and second blue filters is less than the number of the green filters.

2. The device of claim 1, further comprising:
    an analog front end (AFE)/AD converter (ADC) for performing analog processing for an output signal of the image sensor, converting the processed signal to a digital signal and outputting the digital signal as a video signal; and
    an image processing section for processing the video image outputted from the AFE/ADC to generate a luminance signal and a color signal.

3. The device of claim 2, wherein the filters of the image sensor are placed continuously in the form of a matrix of n×q (n and q are integers equal to or more than 2) as a basis, and
    the image processing section comprises a color signal generation block for generating a color signal by performing processing of generating a color signal at the centroid of an m×p (m and p are integers equal to or more than 2) matrix using m×p matrix processing for the video signal continuously while shifting the centroid position of the m×p matrix by one pixel at a time.

4. The device of claim 3, wherein when a plurality of filters having the same spectral characteristics are included in a range of the object of m×p (m and p are integers equal to or more than 2) matrix processing, the color signal generation block uses a coefficient with which a weighted average of pixel values corresponding to such filters can be obtained.

5. The device of claim 3, wherein the image processing section further comprises a luminance signal generation block for generating a luminance signal by performing processing of generating a luminance signal at the centroid of an m×p (m and p are integers equal to or more than 2) matrix using m×p matrix processing for the video signal continuously while shifting the centroid position of the m×p matrix by one pixel at a time, and in generation of a luminance signal, the luminance signal generation block performs correction for the video signal using a luminance signal correction value obtained based on variations in spectral characteristics included in the video signal, and performs luminance generation using the corrected video signal.

6. The device of claim 3, wherein the image processing section further comprises a luminance signal generation block for generating a luminance signal by performing processing of generating a luminance signal at the centroid of an m×p (m and p are integers equal to or more than 2) matrix using m×p matrix processing for the video signal continuously while shifting the centroid position of the m×p matrix by one pixel at a time, and the luminance signal generation block derives a luminance generation correction coefficient considering spectral characteristics of color filters in an m×p matrix to be processed, and corrects a luminance signal generated using the video signal with the correction coefficient to thereby perform luminance signal adjustment.

7. An imaging device comprising an image sensor having a plurality of unit pixels arranged on a chip, the imaging sensor comprising, for each unit pixel:

a photoelectric conversion element for photoelectrically converting incident light; and a filter placed above the photoelectric conversion element for selectively transmitting only wavelengths of part of the incident light;

wherein the filters are multilayer filters formed of an inorganic material, the filters consist of four types of filters, which include a red filter for selectively transmitting a wavelength band belonging to red, a green filter for selectively transmitting a wavelength band belonging to green, and first and second blue filters for selectively transmitting a wavelength band belonging to blue, transmission peak wavelengths of the first and second blue filters being different from each other, the difference in transmission peak wavelength between the first and second blue filters is 10 nm or more and less than 80 nm, and on the image sensor, the number of the red filters, the number of the first blue filters, the number of the second blue filters, and the number of the green filters are equal to one another.

8. The device of claim 7, further comprising:

an analog front end (AFE)/AD converter (ADC) for performing analog processing for an output signal of the image sensor, converting the processed signal to a digital signal and outputting the digital signal as a video signal; and an image processing section for processing the video image outputted from the AFE/ADC to generate a luminance signal and a color signal.

* * * * *